(12) United States Patent
Araki

(10) Patent No.: US 10,186,946 B2
(45) Date of Patent: Jan. 22, 2019

(54) SWITCHING ELEMENT DRIVING DEVICE

(71) Applicant: FUJI ELECTRIC CO., LTD., Kawasaki-shi, Kanagawa (JP)

(72) Inventor: Ryu Araki, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/908,194

(22) Filed: Feb. 28, 2018

(65) Prior Publication Data

US 2018/0294709 A1 Oct. 11, 2018

(30) Foreign Application Priority Data

Apr. 5, 2017 (JP) .................................. 2017-075129

(51) Int. Cl.
*H02M 1/08* (2006.01)
*H02M 7/521* (2006.01)
*H03K 17/16* (2006.01)
*H02M 1/00* (2006.01)

(52) U.S. Cl.
CPC ............. *H02M 1/08* (2013.01); *H02M 7/521* (2013.01); *H03K 17/161* (2013.01); *H02M 2001/0051* (2013.01)

(58) Field of Classification Search
CPC ........... H02M 1/08; H02M 2001/0051; H02M 7/521; H03K 17/161; H03K 17/165
See application file for complete search history.

(56) References Cited

U.S. PATENT DOCUMENTS 7,141,957 B2 * 11/2006 Tolle ...................... H02M 1/38
 323/284
9,590,616 B2 * 3/2017 Inoue ...................... H02M 1/08
9,780,636 B2 * 10/2017 Deboy .................. H02M 1/083

FOREIGN PATENT DOCUMENTS

JP 2013-223265 A 10/2013

* cited by examiner

*Primary Examiner* — Patrick O'Neill
(74) *Attorney, Agent, or Firm* — Rabin & Berdo, P.C.

(57) ABSTRACT

A switching element driving device for driving first and second switching elements of a half bridge circuit, the first and second switching elements being respectively formed in upper and lower arm units of the half bridge, and having respectively first and second freewheeling diodes connected thereto in antiparallel. The switching element driving device includes upper and lower arm driving circuits respectively configured to output first and second driving signals for driving the first and second switching elements, and a drive capability decision circuit configured to, responsive to turning on of the first switching element, set drive capability of the first driving signal to a first level and to change the drive capability of the first driving signal to a second level upon detecting a reverse recovery current of the second freewheeling diode of the second switching element, the first level being higher than the second level.

11 Claims, 12 Drawing Sheets

SWITCHING ELEMENT DRIVING DEVICE

CROSS-REFERENCE TO RELATED APPLICATION

This application is based upon and claims the benefit of priority of the prior Japanese Patent Application No. 2017-075129, filed on Apr. 5, 2017, the entire contents of which are incorporated herein by reference.

BACKGROUND OF THE INVENTION

1. Field of the Invention

The embodiments discussed herein relate to a switching element driving device.

2. Background of the Related Art

An inverter for driving a three-phase motor uses a power module formed by parallelly linking three pairs of serially connected switching elements. Such a power module includes an upper arm driving integrated circuit (IC) for driving a switching element that forms an upper arm and a lower arm driving IC for driving a switching element that forms a lower arm. Each of the drive ICs has functions of overcurrent protection, overheat detection, and low voltage protection, so that such a power module forms an intelligent power module (IPM).

FIG. 11 is a circuit diagram illustrating an inverter circuit for a single phase of a power module, and FIG. 12 illustrates operation waveforms when a switching element of an upper arm is turned on.

In a power module 100 illustrated in FIG. 11, switching elements of an upper arm and a lower arm are N-channel metal-oxide-semiconductor field-effect transistors (MOS-FETs) (hereinafter, referred to as MOS transistor) 101 and 102. A freewheeling diode 103 is connected in antiparallel to the MOS transistor 101 of the upper arm, and a freewheeling diode 104 is connected in antiparallel to the MOS transistor 102 of the lower arm. The freewheeling diodes 103 and 104 are body diodes (parasitic diodes) in the MOS transistors 101 and 102.

The drain of the MOS transistor 101 of the upper arm is connected to a positive terminal P of the power module 100, and this positive terminal P is connected to a direct-current power supply Vdc and the positive terminal of a smoothing capacitor C. The source of the MOS transistor 101 is connected to the drain of the MOS transistor 102 of the lower arm and an output terminal OUT of the power module 100. The output terminal OUT is connected to one terminal of a coil L that forms a certain phase of the motor. The other terminal of the coil L is connected to a negative terminal N of the power module 100. The source of the MOS transistor 102 of the lower arm is connected to the negative terminal N of the power module 100, and this negative terminal N is connected to the direct-current power supply Vdc and the negative terminal of the smoothing capacitor C.

The MOS transistor 101 of the upper arm is driven by an upper arm driving circuit 105 that is an integrated circuit. The upper arm driving circuit 105 includes an input terminal IN1, a power supply terminal VccH, a common ground terminal COM1, an upper arm reference voltage terminal VS, an output terminal OH, and an upper arm power supply terminal VB. The input terminal IN1 of the upper arm driving circuit 105 is connected to an upper arm input terminal INH of the power module 100. The power supply terminal VccH of the upper arm driving circuit 105 is connected to the positive terminal of a direct-current control power supply Vcc, and the common ground terminal COM1 is connected to the negative terminal of the direct-current control power supply Vcc and the negative terminal N of the power module 100. The upper arm reference voltage terminal VS of the upper arm driving circuit 105 is connected to the source of the MOS transistor 101 and the output terminal OUT of the power module 100, and the output terminal OH is connected to the gate of the MOS transistor 101. The upper arm power supply terminal VB of the upper arm driving circuit 105 is connected to one terminal of a bootstrap capacitor Cb, and the other terminal of the bootstrap capacitor Cb is connected to the upper arm reference voltage terminal VS. Also, the upper arm power supply terminal VB is connected to the positive terminal of the direct-current control power supply Vcc via a bootstrap resistor Rb and a bootstrap diode Db. The bootstrap capacitor Cb, the bootstrap resistor Rb, and the bootstrap diode Db compose a bootstrap circuit for supplying power to the upper arm driving circuit 105 of the upper arm.

The MOS transistor 102 of the lower arm is driven by a lower arm driving circuit 106 that is an integrated circuit. The lower arm driving circuit 106 includes an input terminal IN2, a power supply terminal VccL, a common ground terminal COM2, and an output terminal OL. The input terminal IN2 of the lower arm driving circuit 106 is connected to a lower arm input terminal INL of the power module 100. The power supply terminal VccL of the lower arm driving circuit 106 is connected to the positive terminal of the direct-current control power supply Vcc, and the common ground terminal COM2 is connected to the negative terminal of the direct-current control power supply Vcc and the negative terminal N of the power module 100. The output terminal OL of the lower arm driving circuit 106 is connected to the gate of the MOS transistor 102.

Note that each of the upper arm driving circuit 105 and the lower arm driving circuit 106 has an overcurrent protection function that stops switching operation when detecting overcurrent, an overheat detection function that stops switching operation when detecting an overheated state, and a low-voltage protection function that stops switching operation when detecting decrease of the power supply voltage.

In the power module 100 having the above configuration, the upper arm driving circuit 105 and the lower arm driving circuit 106 receive on-off signals from a processor of a higher level and turn on or off the MOS transistors 101 and 102. Also, the upper arm driving circuit 105 and the lower arm driving circuit 106 are configured with semiconductor integrated circuits having the same configuration.

Here, a case will be described in which the upper arm driving circuit 105 turns on the MOS transistor 101 from a turn-off state, and the lower arm driving circuit 106 turns off the MOS transistor 102 from a turn-on state.

First, when the MOS transistor 101 of the upper arm is turned off, and the MOS transistor 102 of the lower arm is turned on, the upper arm reference voltage terminal VS is connected to the negative terminal of the direct-current control power supply Vcc. Hence, the bootstrap capacitor Cb is charged with the voltage obtained by subtracting the voltage drop of the bootstrap resistor Rb and the forward voltage of the bootstrap diode Db from the voltage of the direct-current control power supply Vcc.

First, the MOS transistor 102 of the lower arm is turned off, while the MOS transistor 101 of the upper arm is turned off. This is to prevent the current flowing through the MOS transistor 101 and the MOS transistor 102, which might occur when the MOS transistor 101 of the upper arm and the MOS transistor 102 of the lower arm are turned on and off simultaneously. When the MOS transistor 102 of the lower arm is turned off, the electric current flowing through the MOS transistor 102 is commutated by the freewheeling diode 104 of the lower arm, and the electric current is supplied to the coil L from the freewheeling diode 104 of the lower arm. This is the initial state of FIG. 12. Note that the forward direction of the lower arm diode current IF illustrated in FIG. 12 is the direction of the dashed line arrow of FIG. 11.

When the MOS transistor 101 of the upper arm is turned on in this state, the upper arm reference voltage terminal VS is connected to the positive terminal of the direct-current power supply Vdc, and the freewheeling diode 104 of the lower arm is reversely biased. Thereby, the upper arm reference voltage terminal VS is cut off from the negative terminal N of the power module 100, and the power is supplied from the bootstrap capacitor Cb to the upper arm driving circuit 105. Also, a circuit is formed in which electric current flows from the positive terminal of the direct-current power supply Vdc via the MOS transistor 101 and the coil L to the negative terminal of the direct-current power supply Vdc, and the drain current ID of the MOS transistor 101 increases as illustrated in FIG. 12. Along with this, the drain-source voltage VDS of the MOS transistor 101 decreases, and conversely the drain-source voltage VDS of the MOS transistor 102 (not illustrated in the drawing) rises, so that the freewheeling diode 104 is reversely biased. Although the electric current IF is still flowing from the freewheeling diode 104 of the lower arm to the coil L immediately after the turn-on operation of the MOS transistor 101 has started, the electric current IF flowing through the freewheeling diode 104 decreases as the reverse bias voltage of the freewheeling diode 104 becomes larger.

The electric current IF flowing through the freewheeling diode 104 does not stop decreasing at zero, but the electric current IF reaches a negative region (in which the direction of the electric current is opposite to the dashed line arrow of FIG. 11) so that reverse recovery current starts flowing. Note that the reverse recovery current flows to change the electric charge balance at the PN junction of the diode from a stabilized state in which forward voltage is applied to the diode to a state in which opposite direction voltage is applied to the diode, and the reverse recovery current flows in the direction opposite to the forward electric current. If the reverse recovery current reaches its peak, then the reverse recovery current rapidly decreases and becomes zero in a steady state. The thick line part indicated by +di/dt in FIG. 12 is a region in which the reverse recovery current decreases rapidly.

As illustrated in FIG. 12, a phenomenon is observed in which the VB-VS voltage, which is the power supply voltage of the upper arm driving circuit 105, drops instantaneously in the region in which the reverse recovery current decreases rapidly, and the low-voltage protection function is operated to stop the switching operation of the power module 100. This phenomenon occurred more frequently, as the switching operation speed becomes higher.

The inventor has a next opinion with regard to the mechanism of the VB-VS voltage dropping instantaneously. First, as the reverse recovery current decreases rapidly, the change rate of the electric current flowing through the wiring inductance of the lower arm becomes very large to generate electromotive force in the wiring inductance, and the electric potential of the upper arm reference voltage terminal VS changes rapidly in relation to the common ground terminal COM1. In addition or alternatively, the charge voltage of the junction capacitance of the freewheeling diode rises sharply in this region due to the reverse recovery current, and the electric potential of the upper arm reference voltage terminal VS changes rapidly.

Here, if the bootstrap capacitor Cb exists independently, the change amount of the electric potential at the upper arm power supply terminal VB is equal to the change amount at the upper arm reference voltage terminal VS, and the VB-VS voltage does not decrease. However, the common ground terminal COM1 and the upper arm power supply terminal VB are actually connected by a parasitic diode inside the upper arm driving circuit 105. That is, the upper arm driving circuit 105 is configured with a semiconductor integrated circuit, and thus various PN junctions, i.e. diodes, exist between the common ground terminal COM1 and the upper arm power supply terminal VB. Also, diodes have junction capacitances inevitably. In FIG. 11, a diode 107 and a junction capacitance 108 represent these diodes and the junction capacitances. That is, it is conceived that the upper arm power supply terminal VB is connected to the common ground terminal COM1 via various capacitances, and as the change of the electric potential of the upper arm reference voltage terminal VS becomes faster, the change is transferred to these capacitances more easily, and consequently the change amount of the electric potential at the upper arm power supply terminal VB differs from the change amount at the upper arm reference voltage terminal VS.

There is a known technology for reducing such sharp change of +di/dt (for example, refer to Japanese Laid-open Patent Publication No. 2013-223265). Although the technology described in this Japanese Laid-open Patent Publication No. 2013-223265 uses an insulated gate bipolar transistor (IGBT) as a switching element, Japanese Laid-open Patent Publication No. 2013-223265 describes a solution to a similar problem. That is, according to Japanese Laid-open Patent Publication No. 2013-223265, the gate drive resistance of the IGBT is set to a first resistance value, and the IGBT is turned on, and when the gate voltage reaches to a threshold value at which the main electric current of the IGBT starts flowing, the gate drive resistance is switched to a second resistance value that is larger than the first resistance value. Thereby, the falling slope of the collector-emitter voltage of the IGBT becomes more gradual, and the negative absolute value is reduced when the collector current of the IGBT reaches its peak current and thereafter decreases. As a result, the change rate of the reverse recovery current in the freewheeling diode of the IGBT that is turned off is lessened, and the power supply voltage for driving the IGBT is prevented from decreasing.

In the technology described in Japanese Laid-open Patent Publication No. 2013-223265, the excessive di/dt is prevented from occurring, by determining the electric current flowing through the switching element on the basis of the gate voltage or the source-drain voltage and changing the gate drive capability. However, there are other parameters that decide the electric current flowing through the switching element, and when those parameters differ, the electric current flowing through the switching element is unable to be detected accurately only from the gate voltage or the source-drain voltage.

Moreover, Japanese Laid-open Patent Publication No. 2013-223265 includes no description relevant to the above phenomenon in which the VB-VS voltage decreases instantaneously. In order to prevent this phenomenon, it is needed to reduce the change of the reverse recovery current in the region where the VB-VS voltage decreases. On the other hand, in order to decrease the switching loss, it is needed to keep the load current by setting as short a switching time as possible. As described below, an effective method to simultaneously achieve the both is rapidly increasing the electric current of the switching element until the electric current flowing through the switching element reaches a needed load current and suppressing the increase of the electric current after the electric current reaches the needed load current. However, the technology described in Japanese Laid-open Patent Publication No. 2013-223265 is unable to achieve this.

SUMMARY OF THE INVENTION

According to one aspect, there is provided a switching element driving device for driving first and second switching elements forming an upper arm unit and a lower arm unit of a half bridge, respectively, and including a first freewheeling diode and a second freewheeling diode, respectively. The switching element driving device includes: an upper arm driving circuit configured to output a first driving signal for driving the first switching element; a lower arm driving circuit configured to output a second driving signal for driving the second switching element; and a drive capability decision unit configured to, when the first switching element is turned on, set drive capability of the first driving signal to a high level at beginning and to change the drive capability of the first driving signal to a low level upon detecting a reverse recovery current of the second freewheeling diode of the second switching element.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 12 illustrates operation waveforms when a switching element of an upper arm is turned on.

DETAILED DESCRIPTION OF THE INVENTION

Figure 1:
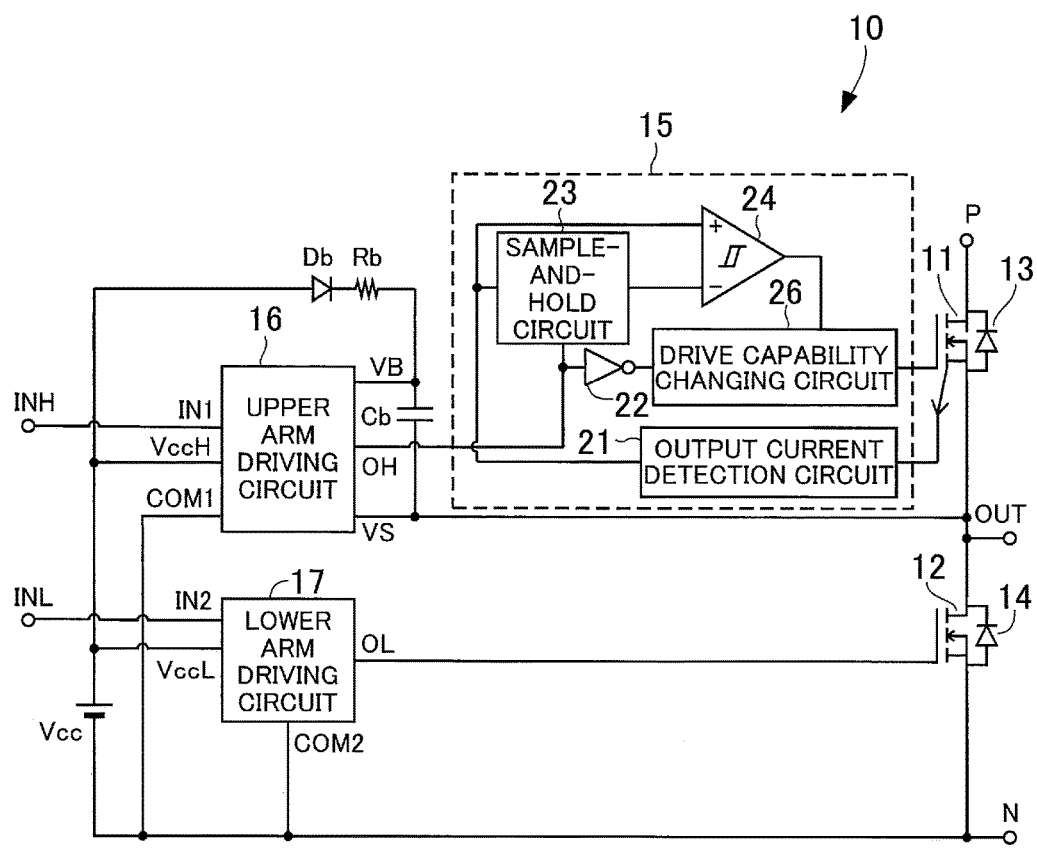
FIG. 1 is a circuit diagram illustrating an inverter circuit for a single phase of a power module according to a first embodiment.

Several embodiments will be described below with reference to the accompanying drawings, wherein like reference numerals refer to like elements throughout. Note that each embodiment may be carried out by combining parts of a plurality of embodiments without inconsistency. Also, in the following description, terminal name, voltage, signal, and the like of the same terminal are sometimes denoted by the same reference sign.

Figure 2:
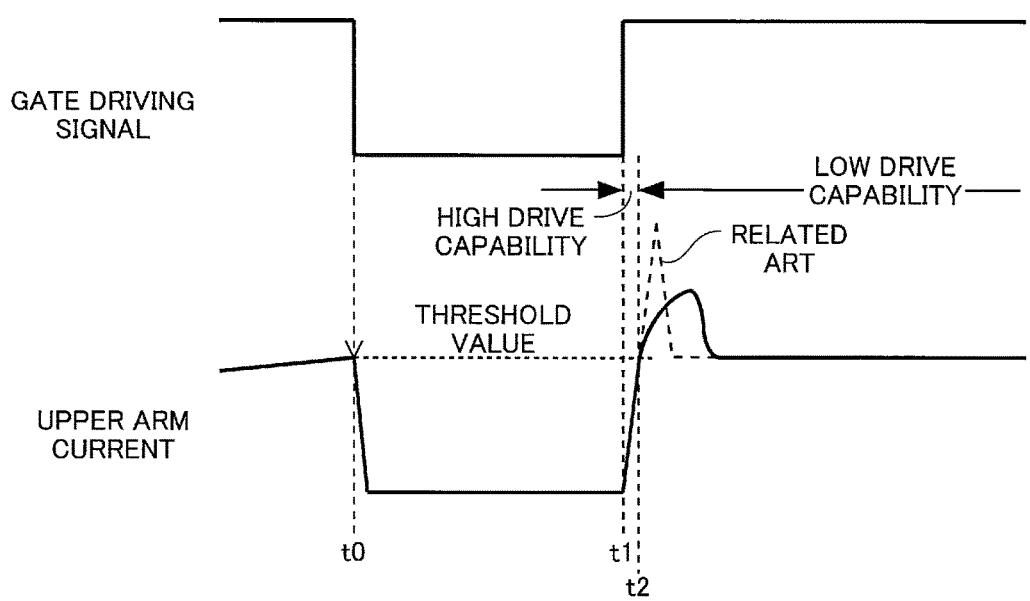
FIG. 2 is a timing chart illustrating an operation outline of a power module according to the first embodiment.

FIG. 1 is a circuit diagram illustrating an inverter circuit for a single phase of a power module according to a first embodiment, and FIG. 2 is a timing chart illustrating an operation outline of the power module according to the first embodiment.

A power module 10 according to the first embodiment includes MOS transistors 11 and 12 as switching elements of an upper arm and a lower arm at an output stage. The MOS transistor 11 of the upper arm includes a freewheeling diode 13 connected in antiparallel, and the MOS transistor 12 of the lower arm includes a freewheeling diode 14 connected in antiparallel.

The drain of the MOS transistor 11 of the upper arm is connected to a positive terminal P of the power module 10, and this positive terminal P is connected to a positive terminal of a direct-current power supply (not depicted). The source of the MOS transistor 11 is connected to the drain of the MOS transistor 12 of the lower arm and an output terminal OUT of the power module 10, and the output terminal OUT is connected to a load (not depicted). The source of the MOS transistor 12 of the lower arm is connected to a negative terminal N of the power module 10, and this negative terminal N is connected to a negative terminal of the direct-current power supply (not depicted).

The MOS transistor 11 of the upper arm is driven by an upper arm driving circuit 16 via a gate drive capability deciding unit (i.e., a gate drive capability deciding circuit) 15. The gate drive capability deciding unit 15 includes an output current detection circuit 21, an inverter circuit 22, a sample-and-hold circuit 23, a comparator 24, and a drive capability changing circuit 26.

The output current detection circuit 21 of the gate drive capability deciding unit 15 has an input terminal for inputting the output current of a sense MOS transistor, described later, which is proportional to the output current of the MOS transistor 11, and an output terminal of the output current detection circuit 21 is connected to an input terminal of the sample-and-hold circuit 23 and a non-inverting input terminal of the comparator 24. An output terminal of the sample-and-hold circuit 23 is connected to an inverting input terminal of the comparator 24. Also, a control input terminal of the sample-and-hold circuit 23 is connected to an output terminal OH of the upper arm driving circuit 16. An output terminal of the comparator 24 is connected to a control input terminal of the drive capability changing circuit 26. An input terminal of the drive capability changing circuit is connected to an output terminal of the inverter circuit 22, and an input terminal of the inverter circuit 22 is connected to the output terminal OH of the upper arm driving circuit 16. An output terminal of the drive capability changing circuit 26 is connected to the gate of the MOS transistor 11. The comparator 24 is a hysteresis comparator, and the level of the signal input into the inverting input terminal is switched by the output of the comparator 24. Here, a larger signal among the signals having different levels is the output of the above sample-and-hold circuit 23, and a smaller signal is obtained by dividing the output of the sample-and-hold circuit 23 by a voltage dividing circuit (not depicted).

The upper arm driving circuit 16 includes an input terminal IN1, a power supply terminal VccH, a common ground terminal COM1, an upper arm reference voltage terminal VS, an output terminal OH, and an upper arm power supply terminal VB. The input terminal IN1 of the upper arm driving circuit 16 is connected to an upper arm input terminal INH of the power module 10. The power supply terminal VccH of the upper arm driving circuit 16 is connected to the positive terminal of a direct-current control power supply Vcc, and the common ground terminal COM1 is connected to the negative terminal of the direct-current control power supply Vcc and the negative terminal N of the power module 10. The upper arm reference voltage terminal VS of the upper arm driving circuit 16 is connected to the source of the MOS transistor 11. The upper arm power supply terminal VB of the upper arm driving circuit 16 is connected to one terminal of the bootstrap capacitor Cb, and the other terminal of the bootstrap capacitor Cb is connected to the upper arm reference voltage terminal VS. Also, the upper arm power supply terminal VB is connected to the positive terminal of the direct-current control power supply Vcc via a bootstrap resistor Rb and a bootstrap diode Db.

The MOS transistor 12 of the lower arm is driven by a lower arm driving circuit 17 that is an integrated circuit. The lower arm driving circuit 17 includes an input terminal IN2, a power supply terminal VccL, a common ground terminal COM2, and an output terminal OL. The input terminal IN2 of the lower arm driving circuit 17 is connected to a lower arm input terminal INL of the power module 10. The power supply terminal VccL of the lower arm driving circuit 17 is connected to the positive terminal of the direct-current control power supply Vcc. The output terminal OL of the lower arm driving circuit 17 is directly connected to the gate of the MOS transistor 12.

In the upper arm of the power module 10, the upper arm driving circuit 16 outputs a gate driving signal, and the MOS transistor 11 is turned on and off by the gate driving signal. In particular, in the power module 10 according to the first embodiment, the gate drive capability at the time of turning on the MOS transistor 11 is changed according to the current value of the upper arm measured when the MOS transistor 11 is turned on at the last time. Its details will be described below.

First, as illustrated in FIG. 2, the upper arm driving circuit 16 outputs a gate driving signal of high (H) level to turn on the MOS transistor 11, before a time point t0. In this case, upper arm current for driving the load flows through the MOS transistor 11 of the upper arm.

When the gate driving signal of low (L) level is output to turn off the MOS transistor 11 at the time point t0, the sample-and-hold circuit 23 samples and holds the upper arm current immediately before the turning off, which the output current detection circuit 21 detects at the time point of the falling edge of the gate driving signal, and inputs the upper arm current value into the inverting input terminal of the comparator 24.

Next, at a time point t1 when the gate driving signal becomes H level, the MOS transistor 11 of the upper arm starts switching (turning on) operation. At this time point, the upper arm current does not flow, and thus the comparator 24 outputs an L level signal, and the drive capability changing circuit 26 sets the gate drive capability of the MOS transistor 11 to a high level. The gate drive capability is high level when the MOS transistor 11 is turned on, and thus the rising edge of the upper arm current is sharp to reduce the switching loss of the MOS transistor 11.

In this case, the comparator 24 receives the upper arm current detected by the output current detection circuit 21, and receives the current value held by the sample-and-hold circuit 23 as a threshold value, and compares the upper arm current with the threshold value.

When the comparator 24 detects the upper arm current exceeding the threshold value at a time point t2, the drive capability changing circuit 26 changes the gate drive capability of the MOS transistor 11 to a low level. Here, the load current is assumed to hardly change in one switching cycle, and thus the electric current of the threshold value is equal to the electric current for driving the load, and the electric current exceeding the threshold value is reverse recovery current of the freewheeling diode 14. Thus, the upper arm current exceeding the threshold value at the time point t2 indicates that the reverse recovery current starts flowing at the time point t2. Thus, by changing the gate drive capability of the MOS transistor 11 to a low level at the time point t2 when the reverse recovery current starts flowing, the change of the upper arm current becomes more gradual than the conventional change illustrated with a dashed line in FIG. 2, and thus the change rate and the peak value of the reverse recovery current of the freewheeling diode 14 of the lower arm are lessened, to reduce noise.

The load current is assumed to hardly change in one switching cycle, and thus the switching loss of the MOS transistor 11 is reduced by sharply increasing the upper arm current until the upper arm supplies the load current, and the decrease of the VB-VS voltage is prevented by suppressing the electric current change exceeding the load current which has no relation with load driving.

Next, a specific example of components of the gate drive capability deciding unit 15 will be described.

Figure 3:
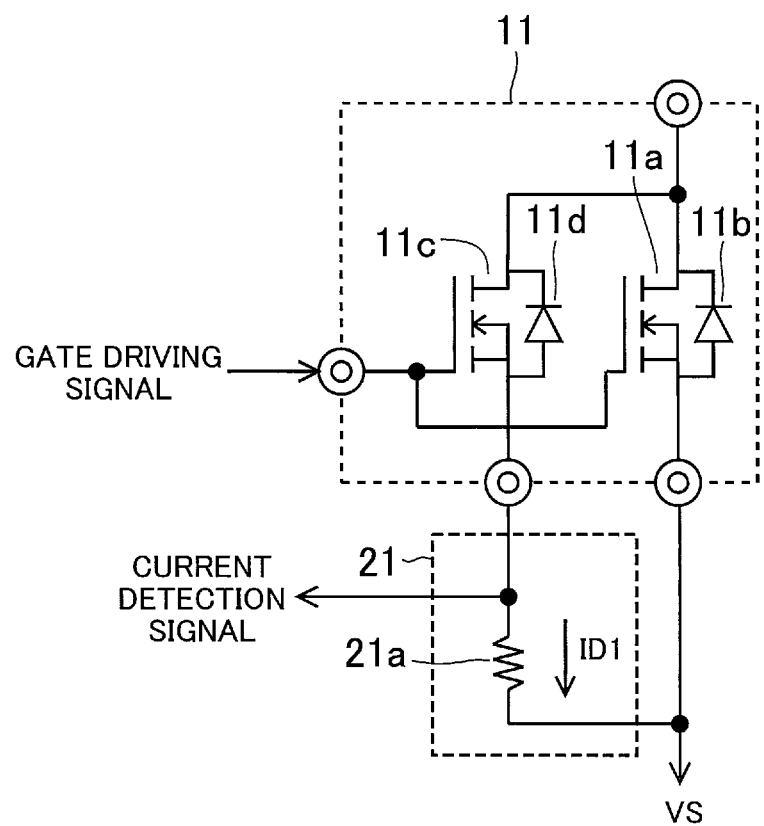
FIG. 3 illustrates an example of a MOS transistor and an output current detection circuit.

FIG. 3 illustrates an example of the MOS transistor and the output current detection circuit.

In the first embodiment, the MOS transistor 11 includes a main MOS transistor 11a and a freewheeling diode 11b for controlling main electric current, and a sense MOS transistor 11c and a freewheeling diode 11d for detecting the electric current of the main MOS transistor 11a (their device size is far smaller than the device size of the main MOS transistor 11a and the freewheeling diode 11b). In this MOS transistor 11, the main MOS transistor 11a and the sense MOS transistor 11c have common drain and gate, and only the respective sources of the main MOS transistor 11a and the sense MOS transistor 11c are independent from each other. The device sizes of the main MOS transistor 11a, the sense MOS transistor 11c, the freewheeling diode 11b, and the freewheeling diode 11d are adjusted in such a manner that the electric current flowing through the main MOS transistor 11a and the freewheeling diode 11b is proportional to the electric current flowing through the sense MOS transistor 11c and the freewheeling diode 11d under the same condition, and a sense signal proportional to the main electric current is output from the source of the sense MOS transistor 11c.

The output current detection circuit 21 includes a current detection resistor 21a. One terminal of this current detection resistor 21a is connected to the source of the sense MOS transistor 11c, and the other terminal of the current detection resistor 21a is connected to the source of the main MOS transistor 11a. The connection point between the current detection resistor 21a and the source of the sense MOS transistor 11c is connected to the input terminal of the sample-and-hold circuit 23 and the non-inverting input terminal of the comparator 24.

In the MOS transistor 11, the main MOS transistor 11a and the sense MOS transistor 11c have a common gate, and thus the source-gate voltages of the both are always equal to each other, and as described above the electric current proportional to the electric current flowing through the main MOS transistor 11a flows through the sense MOS transistor 11c. The electric current ID1 of the sense MOS transistor 11c flows to the upper arm reference voltage terminal VS via the output current detection circuit 21. In this case, the electric current ID1 is converted to a voltage signal by the current detection resistor 21a of the output current detection circuit 21, and is output from the output current detection circuit 21 as a current detection signal.

Figure 4:
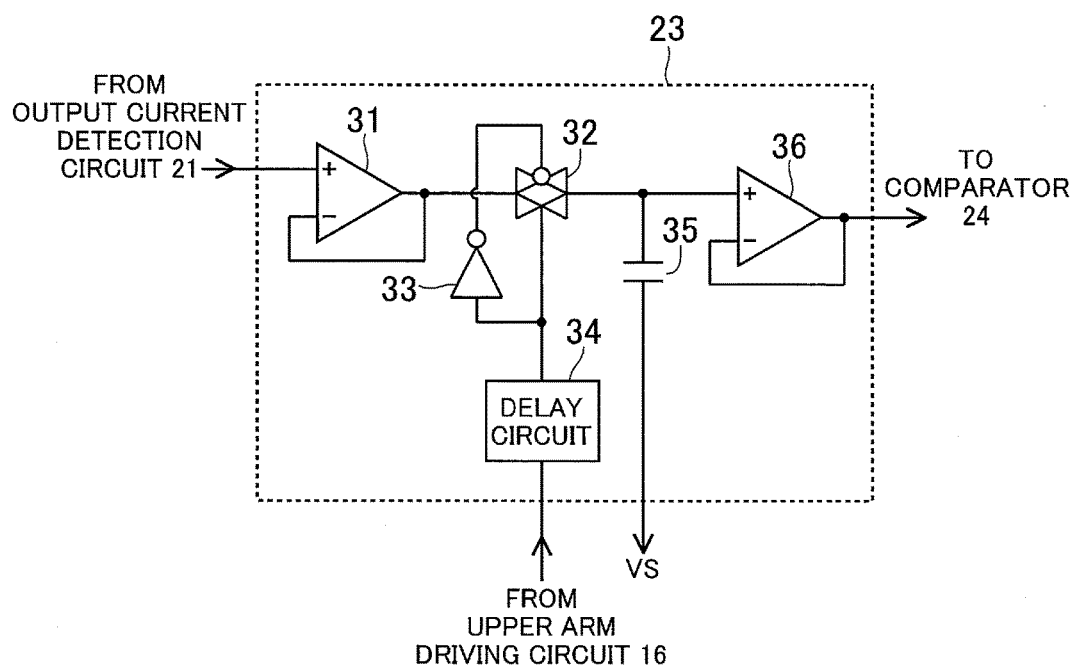
FIG. 4 illustrates an example of a sample-and-hold circuit.

FIG. 4 illustrates an example of the sample-and-hold circuit.

The sample-and-hold circuit 23 includes a voltage follower 31 whose input terminal is connected to the output terminal of the output current detection circuit 21, and the output terminal of the voltage follower 31 is connected to the input terminal of a transfer gate 32. A logic inverting gate terminal of the transfer gate 32 is connected to the output terminal of an inverter circuit 33, and the other gate terminal of the transfer gate 32 is connected to the input terminal of the inverter circuit 33 and the output terminal of a delay circuit 34. The input terminal of the delay circuit 34 is connected to the output terminal OH of the upper arm driving circuit 16.

The output terminal of the transfer gate 32 is connected to one terminal of the capacitor 35, and the other terminal of the capacitor 35 is connected to the upper arm reference voltage terminal VS. Also, the output terminal of the transfer gate 32 is connected to the input terminal of a voltage follower 36, and the output terminal of the voltage follower 36 is connected to the inverting input terminal of the comparator 24. Note that the transfer gate 32 may be configured with other semiconductor switches.

In this sample-and-hold circuit 23, the voltage follower 31 always receives the current detection signal detected by the output current detection circuit 21, and supplies the current detection signal to the transfer gate 32.

The transfer gate 32 is turned off (shut off) when the output signal of the delay circuit 34 is L level, and is turned on (open) when the output signal of the delay circuit 34 is H level. The delay circuit 34 outputs an L level signal without delay when receiving the gate driving signal of L level from the upper arm driving circuit 16, and when receiving the gate driving signal of H level from the upper arm driving circuit 16, outputs an H level output signal after a predetermined time elapses from the time point of the reception. The delay time of the delay circuit 34 is a period for the comparator 24 to compare the output current value that the capacitor 35 holds when the MOS transistor 11 is turned on at the last time with the output current value detected when the MOS transistor 11 is turned on at this time. After the delay time elapses, the transfer gate 32 is turned on to supply the current detection signal detected by the output current detection circuit 21 to the capacitor 35, and the capacitor 35 holds the voltage equivalent to the output current value on a real-time basis. The voltage signal held by the capacitor 35 is supplied to the comparator 24 via the voltage follower 36 as a signal representing a threshold value of comparison reference.

Figure 5:
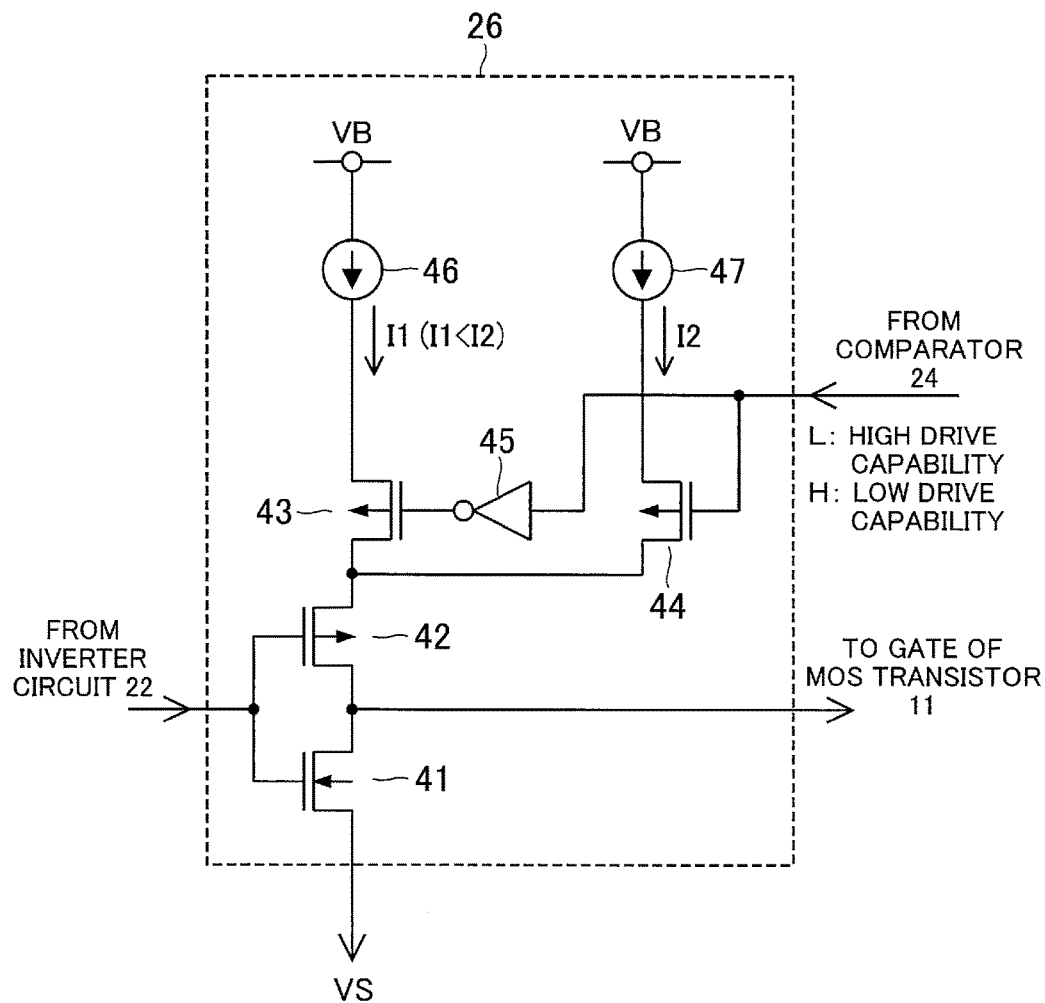
FIG. 5 is a circuit diagram illustrating an example of a drive capability changing circuit.

FIG. 5 is a circuit diagram illustrating an example of the drive capability changing circuit.

The drive capability changing circuit 26 includes an N-channel MOS transistor 41, P-channel MOS transistors 42, 43, and 44, an inverter circuit 45, and constant current sources 46 and 47. The gates of the MOS transistor 41 and the MOS transistor 42 are connected to the output terminal of the inverter circuit 22, and the drains of the MOS transistor 41 and the MOS transistor 42 are connected to the gate of the MOS transistor 11. The source of the MOS transistor 41 is connected to the upper arm reference voltage terminal VS, and the source of the MOS transistor 42 is connected to the drains of the MOS transistors 43 and 44. The sources of the MOS transistors 43 and 44 are connected to the output terminals of the constant current sources 46 and 47 respectively, and the input terminals of the constant current sources 46 and 47 are connected to the upper arm power supply terminal VB. The gate of the MOS transistor 43 is connected to the output terminal of the inverter circuit 45, and the input terminal of the inverter circuit 45 is connected to the gate of the MOS transistor 44 and the output terminal of the comparator 24. Note that the constant current source 46 outputs constant output current I1, and the constant current source 47 outputs constant output current I2, and the output current I1 is set smaller than the output current I2.

In this drive capability changing circuit 26, the MOS transistors 41 and 42 are a signal transmission circuit for transmitting a gate driving signal to the gate of the MOS transistor 11, and the MOS transistors 43 and 44 function as a switch for selectively supplying the output currents I1 and I2 to the signal transmission circuit.

The drive capability changing circuit 26 logically inverts the inverted signal of the gate driving signal received from the inverter circuit 22 again by means of the MOS transistors 41 and 42 of CMOS configuration and supplies the signal to the gate of the MOS transistor 11.

That is, when the gate driving signal output from the upper arm driving circuit 16 is L level, the gate driving signal becomes H level by the inverter circuit 22, and is supplied to the gates of the MOS transistors 41 and 42. Thereby, the MOS transistor 41 is turned on, and the MOS transistor 42 is turned off, and thus an L level signal is supplied to the gate of the MOS transistor 11.

On the other hand, when the gate driving signal output from the upper arm driving circuit 16 is H level, the gate driving signal becomes L level by the inverter circuit 22, and is supplied to the gates of the MOS transistors 41 and 42. Thereby, the MOS transistor 41 is turned off, and the MOS transistor 42 is turned on, and thus an H level signal is supplied to the gate of the MOS transistor 11. In this case, the output current I1 of the constant current source 46 or the output current I2 of the constant current source 47 is supplied to the gate of the MOS transistor 11, and the output signal of the comparator decides whether the output currents I1 or I2 is supplied.

For example, when the output signal of the comparator 24 is L level, the switch of the MOS transistor 43 is turned off, and the switch of the MOS transistor 44 is turned on, and thus the output current I2 of the constant current source 47 is supplied to the gate of the MOS transistor 11.

On the other hand, when the output signal of the comparator 24 is H level, the H level signal is inverted by the inverter circuit 45, and an L level signal is input into the gate of the MOS transistor 43 to turn on the switch of the MOS transistor 43, while the H level signal is directly input into the gate of the MOS transistor 44 to turn off the switch of the MOS transistor 44. In this case, the output current I1 of the constant current source 46, which is lower than the output current I2, is supplied to the gate of the MOS transistor 11 via the MOS transistor 42.

As described above, when the MOS transistor 11 is turned on, the MOS transistor 11 is driven with high drive capability while the output signal of the comparator 24 is L level, and is driven with low drive capability while the output signal of the comparator 24 is H level.

Next, the operation of the power module including the gate drive capability deciding unit 15 of the above specific configuration example will be described.

Figure 6:
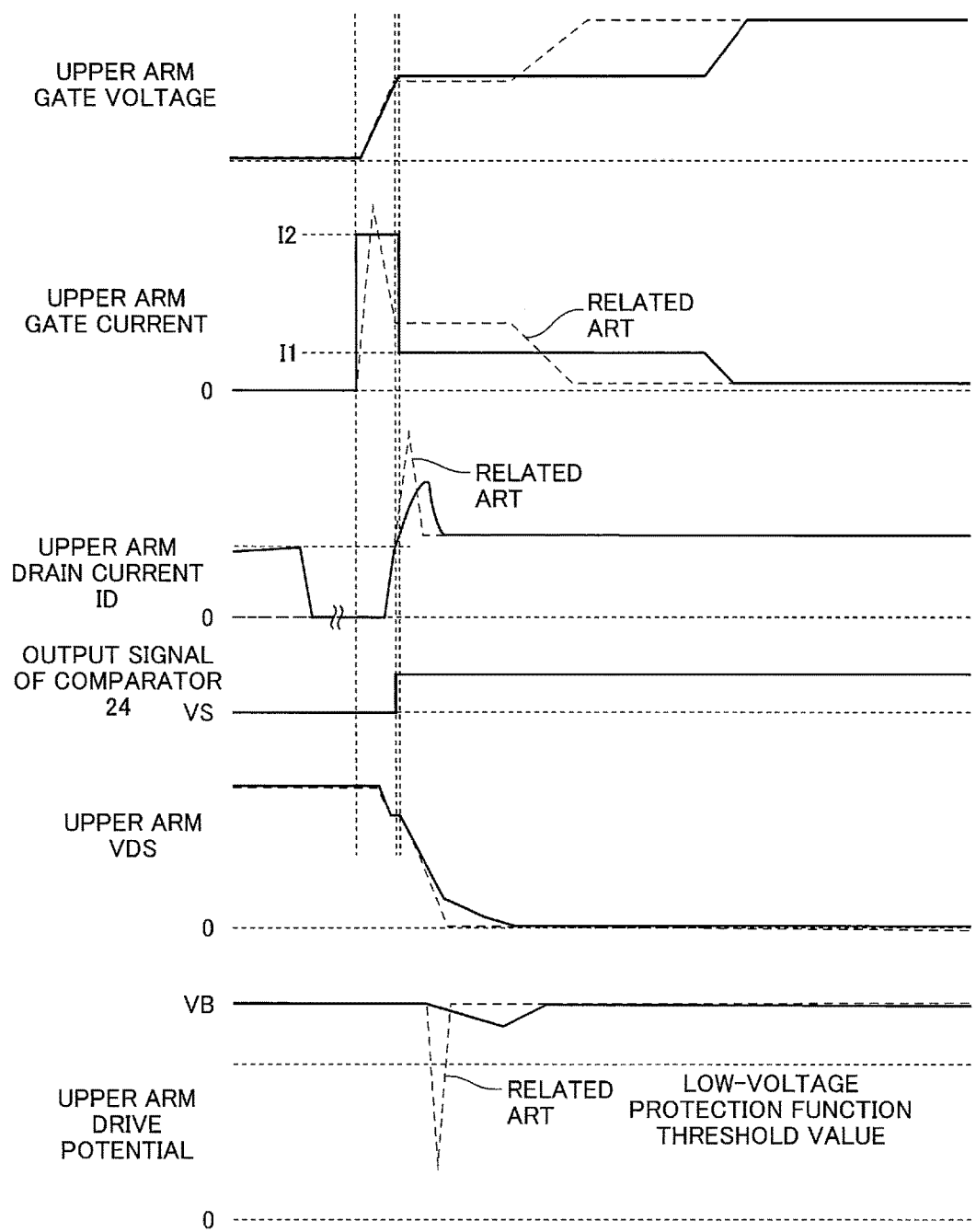
FIG. 6 is a timing chart illustrating details of operation of a power module according to the first embodiment.

FIG. 6 is a timing chart illustrating details of the operation of the power module according to the first embodiment. FIG. 6 illustrates the gate voltage, the gate current, and the drain current ID of the MOS transistor 11 of the upper arm, the output signal of the comparator 24, the drain-source voltage VDS of the MOS transistor 11 of the upper arm, and the drive potential VB of the upper arm, from the top.

Here, when the upper arm driving circuit 16 outputs the gate driving signal of L level to turn off the MOS transistor 11, the sample-and-hold circuit 23 holds the output current value detected when the MOS transistor 11 is turned off most recently.

When the upper arm driving circuit 16 outputs the gate driving signal of H level to turn on the MOS transistor 11, the drive capability changing circuit 26 receives the gate driving signal inverted to L level, and the MOS transistor 42 is turned on in the drive capability changing circuit 26. In this case, the output signal of the comparator 24 is L level, and thus in the drive capability changing circuit 26, the MOS transistor 43 is turned off, and the MOS transistor 44 is turned on, in order to supply the output current I2 to the MOS transistor 42. Thereby, the drive capability changing circuit 26 supplies the output current I2, which is higher than the output current I1, to the gate of the MOS transistor 11. Thereby, the gate capacitance of the MOS transistor 11 is charged by the high drive capability, and the gate voltage rises.

The MOS transistor 11 is driven in the high gate drive capability state, and thereby the drain current ID rises sharply. The drain current ID rises sharply, reducing the switching loss of the MOS transistor 11. Also, the drain-source voltage VDS of the MOS transistor 11 decreases as the drain current ID rises sharply.

This drain current ID is detected by the output current detection circuit 21, and is compared by the comparator 24 with the output current value held by the sample-and-hold circuit 23. When the drain current ID reaches the held output current value, the comparator 24 outputs an H level signal. Thereby, in the drive capability changing circuit 26, the MOS transistor 43 is turned on, and the MOS transistor 44 is turned off, in order to supply the output current I1 to the MOS transistor 42. Thereby, the drive capability changing circuit 26 supplies the output current I1, which is lower than the output current I2, to the gate of the MOS transistor 11.

Hence, the MOS transistor 11 is driven in the low gate drive capability state, and thereby the rise of the drain current ID is made more gradual, and the overshoot of the drain current ID is made smaller. Thereby, the reverse recovery current flowing through the freewheeling diode 14 of the lower arm is made smaller when the drain current ID overshoots, and as a result the change rate of the reverse recovery current of the freewheeling diode 14 is made smaller. Thus, the drop of the drive potential VB of the upper arm, which results from the reverse recovery current or the wiring inductance, is lessened to prevent the low-voltage protection function from working and to prevent occurrence of noise.

Figure 7:
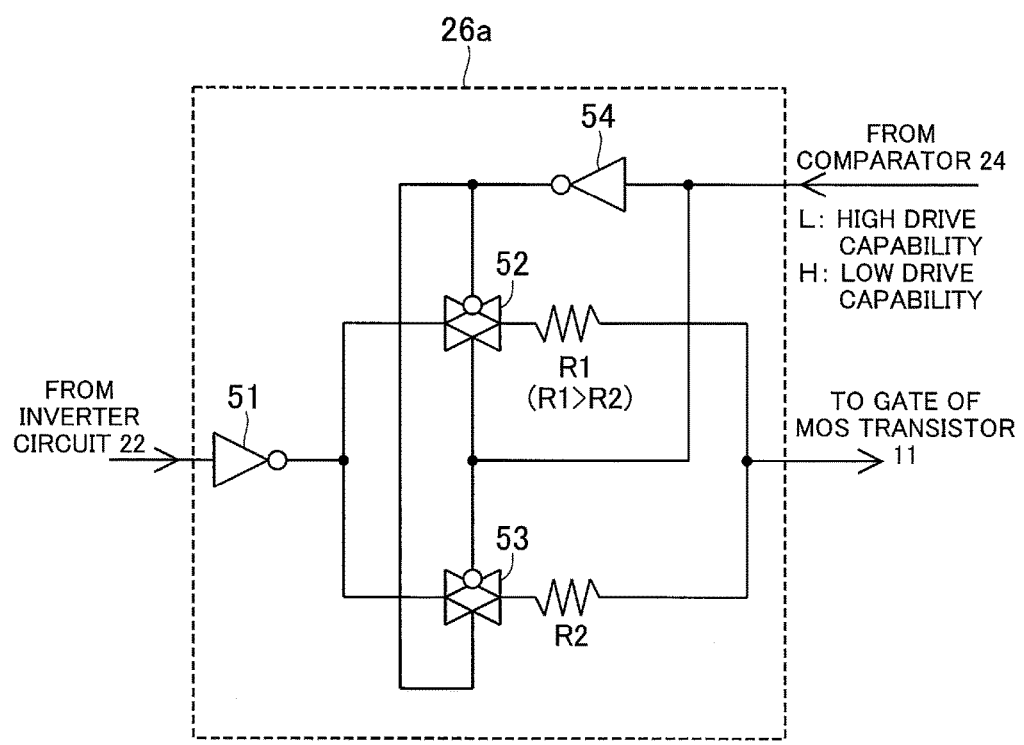
FIG. 7 is a circuit diagram illustrating an example of a drive capability changing circuit in a gate drive capability deciding unit of a power module according to a second embodiment.

FIG. 7 is a circuit diagram illustrating an example of a drive capability changing circuit in a gate drive capability deciding unit of a power module according to a second embodiment. In this second embodiment, the gate drive capability deciding unit 15 has the same configuration as the first embodiment, except for a drive capability changing circuit 26a described below. Thus, the first embodiment is referred to with regard to the configuration except the drive capability changing circuit 26a.

The drive capability changing circuit 26a includes an inverter circuit 51. The input terminal of the inverter circuit 51 is connected to the output terminal of the inverter circuit 22 that receives a gate driving signal from the upper arm driving circuit 16, and the output terminal of the inverter circuit 51 is connected to each of the input terminals of transfer gates 52 and 53 that function as a switch. The output terminal of the transfer gate 52 is connected to one terminal of a current adjustment resistor R1, and the output terminal of the transfer gate 53 is connected to one terminal of a current adjustment resistor R2. The other terminals of the current adjustment resistors R1 and R2 are connected to each other to form an output terminal of the drive capability changing circuit 26a, which is connected to the gate of the MOS transistor 11. The output terminal of an inverter circuit 54 is connected to the logic inverting gate terminal of the transfer gate 52, and the input terminal of the inverter circuit 54 is connected to the other gate terminal of the transfer gate 52. The input terminal of the inverter circuit 54 is connected to the logic inverting gate terminal of the transfer gate 53, and the output terminal of the inverter circuit 54 is connected to the other gate terminal of the transfer gate 53. The input terminal of the inverter circuit 54 is connected to the output terminal of the comparator 24. Note that the current adjustment resistors R1 and R2 have different resistance values, and the resistance value of the current adjustment resistor R1 is set larger than the resistance value of the current adjustment resistor R2.

This drive capability changing circuit 26a logically inverts the gate driving signal received from the inverter circuit 22 by means of the inverter circuit 51, and supplies the signal to the gate of the MOS transistor 11 via the current adjustment resistor R1 or the current adjustment resistor R2. In this case, the logical state of the output signal of the comparator 24 decides whether the current adjustment resistor R1 or the current adjustment resistor R2 intervenes.

That is, when the output signal of the comparator 24 is L level, the transfer gate 53 receives the L level signal at the logic inverting gate terminal, and receives the signal logically inverted by the inverter circuit 54 at the gate terminal, and therefore is turned on (open). In this case, the transfer gate 52 receives the L level signal at the gate terminal, and receives the H level signal at the logic inverting gate terminal, and therefore is turned off (shut off).

Thereby, when the drive capability changing circuit 26a receives a gate driving signal of L level for driving the MOS transistor 11 from the inverter circuit 22, the gate driving signal is first logically inverted by the inverter circuit 51. Next, the gate driving signal, which has been logically inverted to H level, is supplied to the gate of the MOS transistor 11 via the transfer gate 53 and the current adjustment resistor R2. Here, the current adjustment resistor R2 has a smaller resistance than the current adjustment resistor R1, and therefore the MOS transistor 11 is driven with high drive capability.

On the other hand, when the output signal of the comparator 24 is H level, the transfer gate 52 is turned on (open), and the transfer gate 53 is turned off (shut off). Thereby, the drive capability changing circuit 26a logically inverts the gate driving signal received from the inverter circuit 22 by means of the inverter circuit 51, and supplies the signal to the gate of the MOS transistor 11 via the transfer gate 52 and the current adjustment resistor R1. Here, the current adjustment resistor R1 has a larger resistance than the current adjustment resistor R2, and therefore the MOS transistor 11 is driven with low drive capability.

The operation of the power module 10 in the second embodiment is the same as the operation in the first embodiment. That is, when the gate driving signal for turning on and driving the MOS transistor 11 is output, the MOS transistor 11 is first driven with the high drive capability, and when the output current of the upper arm reaches the output current of the last time when the MOS transistor 11 is turned on and driven, the MOS transistor 11 is driven with the low drive capability. The resultant effect is the same as the first embodiment.

Figure 8:
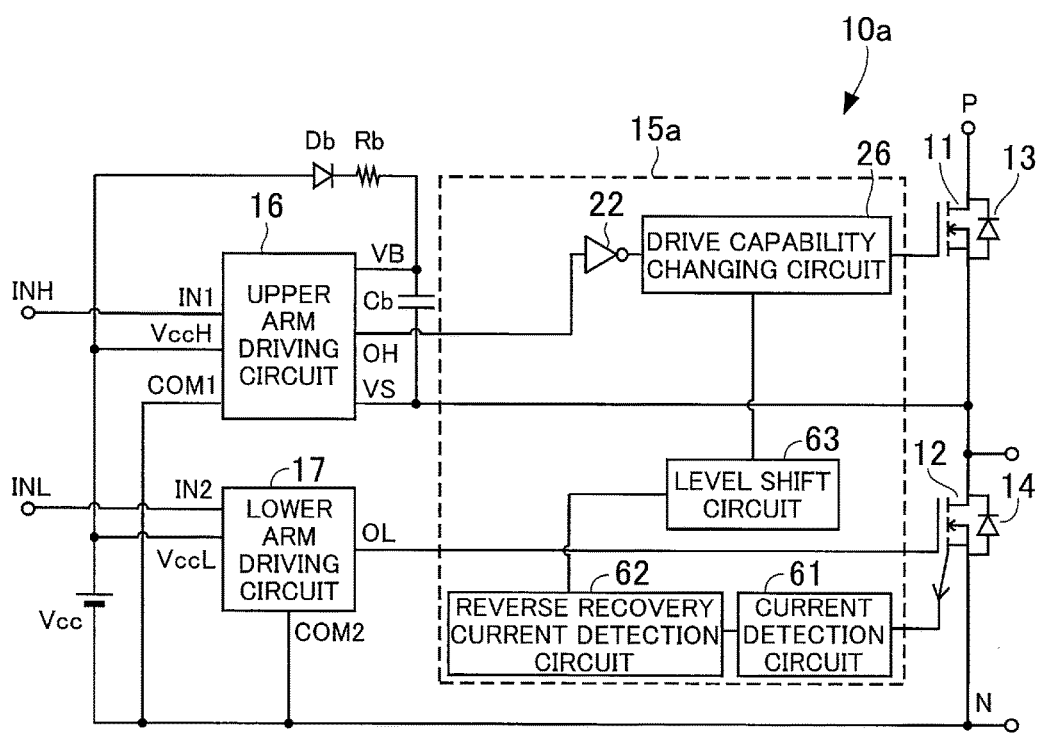
FIG. 8 is a circuit diagram illustrating an inverter circuit for a single phase of a power module according to a third embodiment.
Figure 9:
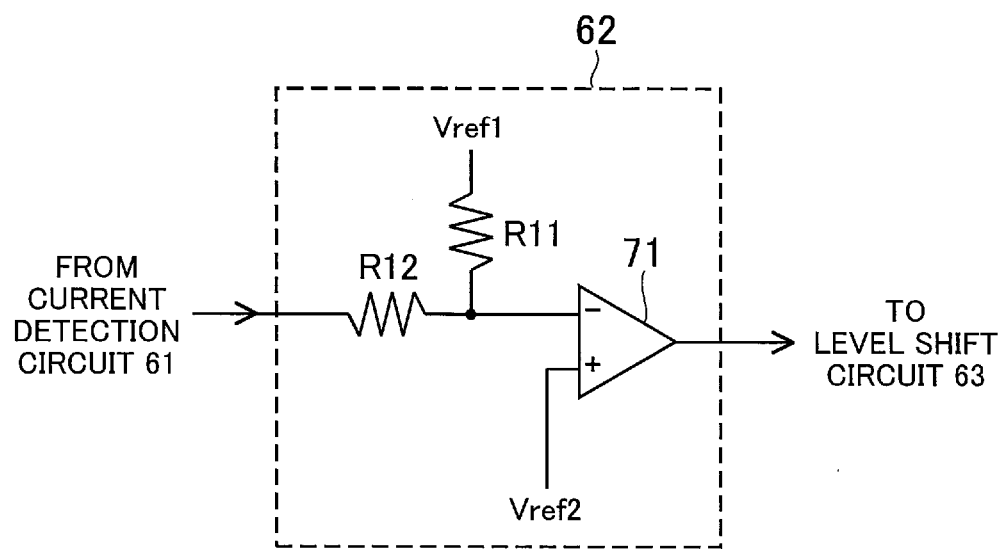
FIG. 9 is a circuit diagram illustrating an example of a reverse recovery current detection circuit.
Figure 10:
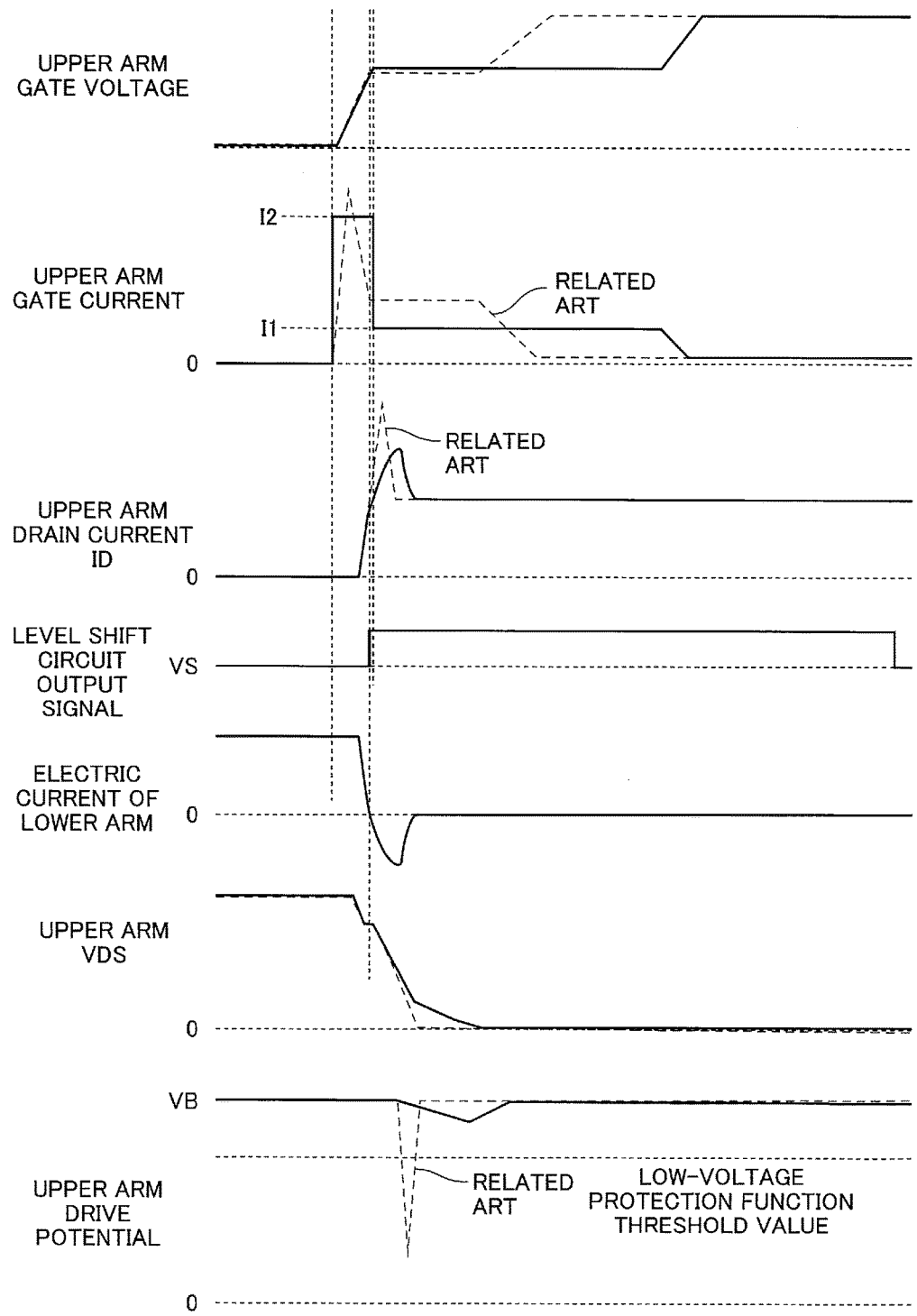
FIG. 10 is a timing chart illustrating details of operation of a power module according to the third embodiment.
Figure 11:
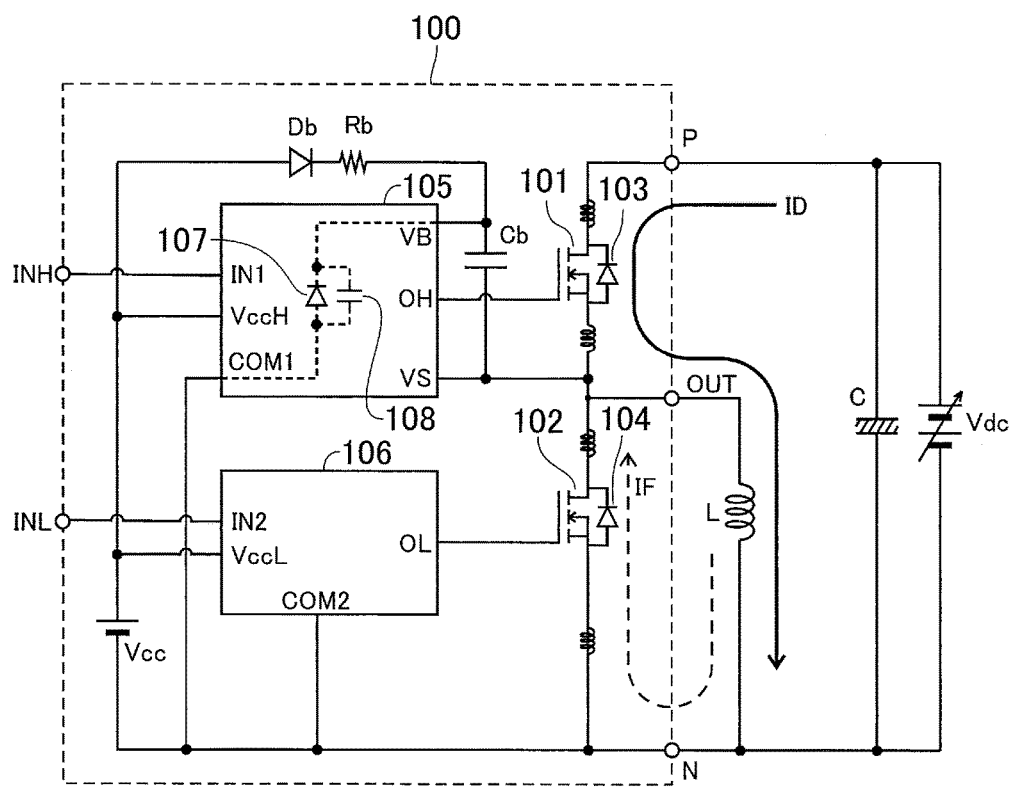
FIG. 11 is a circuit diagram illustrating an inverter circuit for a single phase of a power module.
Figure 12:
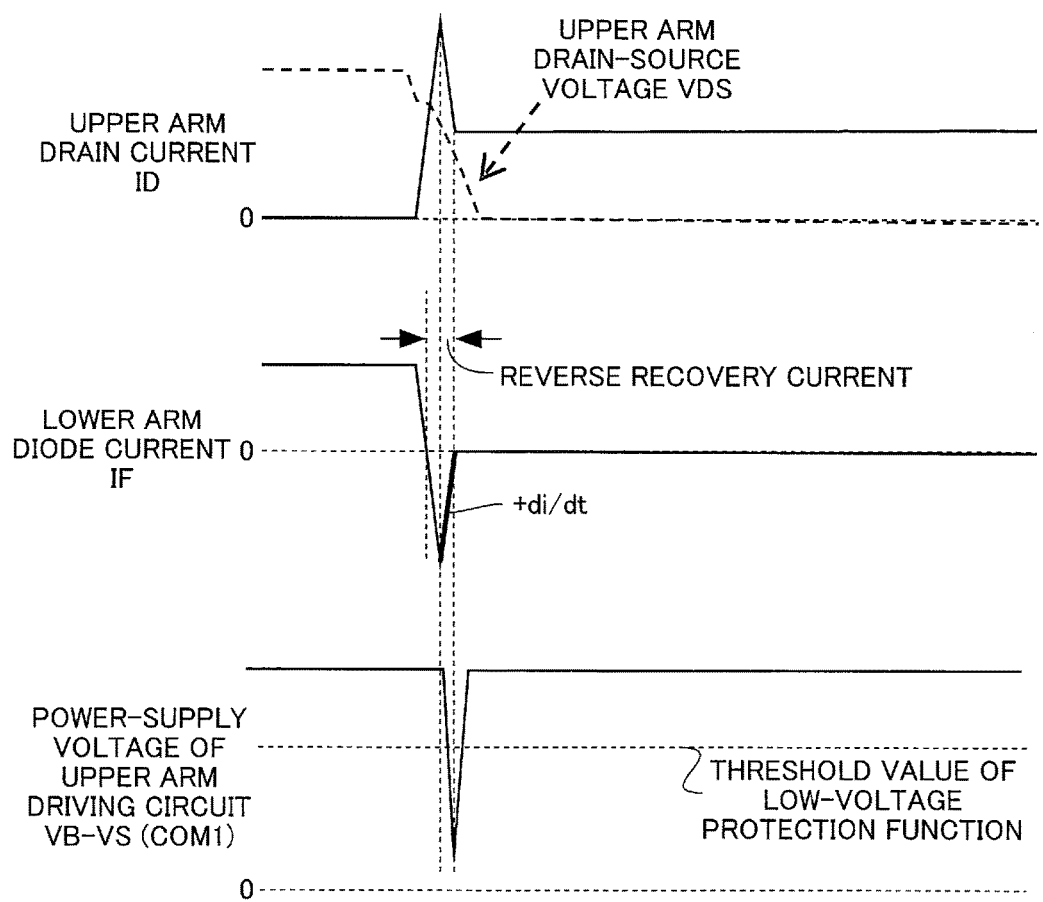

FIG. 8 is a circuit diagram illustrating an inverter circuit for a single phase of a power module according to a third embodiment, and FIG. 9 is a circuit diagram illustrating an example of a reverse recovery current detection circuit, and FIG. 10 is a timing chart illustrating details of operation of a power module according to the third embodiment. In FIG. 8, the components that are the same as or equivalent to the components illustrated in FIG. 1 are denoted with the same reference signs, and their detailed description will be omitted.

In a power module 10a according to the third embodiment, a gate drive capability deciding unit 15a includes a current detection circuit 61, a reverse recovery current detection circuit 62, a level shift circuit 63, an inverter circuit 22, and a drive capability changing circuit 26. The current detection circuit 61 has an input terminal for inputting electric current proportional to the output current of the lower arm, and an output terminal of the current detection circuit 61 is connected to an input terminal of the reverse recovery current detection circuit 62. An output terminal of the reverse recovery current detection circuit 62 is connected to an input terminal of the level shift circuit 63, and an output terminal of the level shift circuit 63 is connected to a control input terminal of the drive capability changing circuit 26. An input terminal of the drive capability changing circuit 26 is connected to an output terminal of the inverter circuit 22, and an output terminal of the drive capability changing circuit 26 is connected to the gate of the MOS transistor 11.

The MOS transistor 12 and the current detection circuit 61 have the same configuration as the MOS transistor 11 and the output current detection circuit 21 illustrated in FIG. 3, and when the reverse recovery current flows through the freewheeling diode 14, the current detection circuit 61 outputs a current detection signal having a value proportional to the reverse recovery current that flows through the freewheeling diode 14 of the lower arm. Note that the reverse recovery current of the freewheeling diode 14 is detected by the current detection resistor 21a converting the reverse recovery current of the freewheeling diode 11d of the sense MOS transistor 11c to voltage.

The reverse recovery current detection circuit 62 includes a comparator 71 and resistors R11 and R12, as illustrated in FIG. 9. An inverting input terminal of the comparator 71 is connected to one terminals of the resistors R11 and R12, and the other terminal of the resistor R11 is connected to a voltage supply Vref1, and the other terminal of the resistor R12 is connected to the output terminal of the current detection circuit 61. A non-inverting input terminal of the comparator 71 is connected to a voltage supply Vref2. Here, the other terminal of the resistor R12 forms an input terminal of the reverse recovery current detection circuit 62, and an output terminal of the comparator 71 forms an output terminal of the reverse recovery current detection circuit 62.

Note that the resistors R11 and R12 and the voltage supplies Vref1 and Vref2 are set to satisfy the following relationship.

$$Vref1 \times R12/(R11+R12) = Vref2 + \Delta V$$

Here, $+\alpha V$ is a minute positive voltage. That is, when the voltage of the input terminal of the reverse recovery current detection circuit 62 decreases and becomes lower than 0 volt (V), the output of the comparator 71 becomes H level which indicates that the reverse recovery current is detected. Also, when the electric current does not flow through the lower arm, the reverse recovery current is not determined to be flowing.

Here, when the MOS transistor 12 of the lower arm is turned on, the current detection circuit 61 detects some output current flowing through the lower arm, which is not the reverse recovery current, and thus a voltage signal higher than zero is input into the input terminal of the reverse recovery current detection circuit 62. In this case, the voltage of the inverting input terminal of the comparator 71 is higher than the voltage of the voltage supply Vref2 applied to the non-inverting input terminal, and therefore the comparator 71 outputs an L level signal.

During the switching of the upper and lower arms, the MOS transistor 12 of the lower arm is first turned off, and the electric current flowing through the MOS transistor 12 of the lower arm is commutated by the freewheeling diode 14. Thereafter, when the MOS transistor 11 of the upper arm starts turning on, the electric current of the freewheeling diode 14 decreases. Then, the electric current of the lower arm crosses zero level and becomes lower than zero level (i.e., opposite-direction current flows through the freewheeling diode 14), and enters the reverse recovery current region. In the reverse recovery current region, voltage lower than 0 V is input into the input terminal of the reverse recovery current detection circuit 62. In this case, the voltage of the inverting input terminal of the comparator 71 becomes lower than the voltage of the non-inverting input terminal, and thus the comparator 71 outputs an H level signal.

The level shift circuit 63 shifts the H level signal output by the comparator 71 from a lower arm signal with reference to the electric potential of the common ground terminal COM2 to an upper arm signal with reference to the electric potential of the upper arm reference voltage terminal VS. The drive capability changing circuit 26 receives the signal whose level is shifted, and changes the gate drive capability of the MOS transistor 11 from a high level for turning on to a low level. Thereby, the change of the drain current ID of the upper arm is made gradual before the reverse recovery current flows through the freewheeling diode 14 of the lower arm, and thus the change rate and the peak value of the reverse recovery current of the freewheeling diode 14 of the lower arm are lessened.

Although the drive capability changing circuit 26 of FIG. 5 is employed in this embodiment, the drive capability changing circuit 26a of FIG. 7 may be employed.

Although it is preferable that the above embodiments be applied to the power module using the MOS transistors as the switching elements, the above embodiments may be applied to a power module using IGBTs capable of high speed switching.

Moreover, the freewheeling diodes may be independent diodes, and if the switching elements are MOS transistors, the freewheeling diodes may be body diodes of the MOS transistors.

Also, the constant current source 47 and the current adjustment resistor R2, which provide the high drive capability, may be replaced by a simple line.

In the switching element driving device of the above configuration, the drive capability is made higher when the switching element of the upper arm is turned on, and thereby the switching loss is decreased. Also, the drive capability of the switching element of the upper arm is made lower before the reverse recovery current flows through the freewheeling diode of the lower arm, and thereby the change rate of the reverse recovery current is lessened, and noise is reduced.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A switching element driving device for driving first and second switching elements of a half bridge circuit, the first and second switching elements being respectively formed in an upper arm unit and a lower arm unit of the half bridge, and having respectively a first freewheeling diode and a second freewheeling diode connected thereto in antiparallel, the switching element driving device comprising:
    an upper arm driving circuit configured to output a first driving signal for driving the first switching element;
    a lower arm driving circuit configured to output a second driving signal for driving the second switching element; and
    a drive capability decision circuit configured to, responsive to turning on of the first switching element, set drive capability of the first driving signal to a first level and to change the drive capability of the first driving signal to a second level upon detecting a reverse recovery current of the second freewheeling diode of the second switching element, the first level being higher than the second level.

2. The switching element driving device according to claim 1, wherein the drive capability decision circuit includes:
    an output current detection circuit configured to detect an output current of the first switching element;
    a sample-and-hold circuit configured to sample and hold a value of the output current before the first switching element is turned off and output the held value;
    a comparator configured to compare the output current detected by the output current detection circuit with a threshold value that is the value outputted from the sample-and-hold circuit; and
    a drive capability changing circuit configured to change the drive capability of the first driving signal to the second level, responsive to detection by the comparator that the output current detected by the output current detection circuit exceeds the threshold value.

3. The switching element driving device according to claim 2, wherein the drive capability changing circuit includes:
    a first constant current source configured to output a first output current;
    a second constant current source configured to output a second output current higher than the first output current;
    a signal transmission circuit configured to transmit the first driving signal to a gate of the first switching element;
    a first switch that is connected between the first constant current source and the signal transmission circuit, and is turned on responsive to the detection by the comparator that the output current detected by the output current detection circuit exceeds the threshold value; and
    a second switch that is connected between the second constant current source and the signal transmission circuit, and is turned on responsive to detection by the comparator that the output current detected by the output current detection circuit is no higher than the threshold value.

4. The switching element driving device according to claim 2, wherein the drive capability changing circuit includes:
    a first switch that receives the first driving signal and is turned on responsive to the detection by the comparator that the output current detected by the output current detection circuit exceeds the threshold value;
    a second switch that receives the first driving signal and is turned on responsive to detection by the comparator that the output current detected by the output current detection circuit is no higher than the threshold value;
    a first resistor connected between the first switch and a gate of the first switching element; and
    a second resistor connected between the second switch and the gate of the first switching element, the second resistor having a smaller resistance value than the first resistor.

5. The switching element driving device according to claim 2, wherein
    the first switching element includes a first metal-oxide-semiconductor field-effect transistor (MOSFET), and a second MOSFET that is a sense MOSFET through which an electric current proportional to an output current of the first MOSFET flows, and
    the output current detection circuit detects the electric current flowing through the second MOSFET.

6. The switching element driving device according to claim 2, wherein the comparator has hysteresis characteristics.

7. The switching element driving device according to claim 1, wherein the drive capability decision circuit includes:
    a current detection circuit configured to detect an electric current of the second switching element;
    a reverse recovery current detection circuit configured to detect the reverse recovery current according to whether the electric current detected by the current detection circuit is higher or lower than zero; and
    a drive capability changing circuit configured to set the drive capability of the first driving signal for the first switching element to the first level responsive to the turning on of the first switching element, and set the drive capability of the first driving signal to the second level responsive to detection by the reverse recovery current detection circuit of the reverse recovery current.

8. The switching element driving device according to claim 7, wherein
the reverse recovery current detection circuit configured to output a signal indicating detection or non-detection of the reverse recovery current, and
the drive capability decision circuit further includes a level shift circuit that shifts a level of the signal indicating detection or non-detection of the reverse recovery current and transfers the level-shifted signal to the drive capability changing circuit.

9. The switching element driving device according to claim 7, wherein the drive capability changing circuit includes:
a first constant current source configured to output a first output current;
a second constant current source configured to output a second output current that is higher than the first output current;
a signal transmission circuit configured to transmit the first driving signal to a gate of the first switching element;
a first switch that is connected between the first constant current source and the signal transmission circuit, and is turned on upon receiving a signal indicating that the reverse recovery current detection circuit detects the reverse recovery current; and
a second switch that is connected between the second constant current source and the signal transmission circuit, and is turned on upon receiving a signal indicating that the reverse recovery current detection circuit does not detect the reverse recovery current.

10. The switching element driving device according to claim 7, wherein the drive capability changing circuit includes:
a first switch that receives the first driving signal and is turned on upon receiving a signal indicating that the reverse recovery current detection circuit detects the reverse recovery current;
a second switch that receives the first driving signal and is turned on upon receiving a signal indicating that the reverse recovery current detection circuit does not detect the reverse recovery current;
a first resistor connected between the first switch and a gate of the first switching element; and
a second resistor connected between the second switch and the gate of the first switching element, the second resistor having a smaller resistance value than the first resistor.

11. The switching element driving device according to claim 7, wherein
the first switching element includes a first metal-oxide-semiconductor field-effect transistor (MOSFET) and the first freewheeling diode corresponding to the first MOSFET,
the second switching element includes a second MOSFET that is a sense MOSFET and the second freewheeling diode corresponding to the second MOSFET, an electric current proportional to an electric current of the first MOSFET and the first freewheeling diode flowing through the second MOSFET, and
the current detection circuit detects the electric current flowing through the second MOSFET and the second freewheeling diode.

* * * * *